(12) United States Patent
Yeh

(10) Patent No.: US 7,220,175 B2
(45) Date of Patent: May 22, 2007

(54) DEVICE FOR CARRYING THIN WAFERS AND METHOD OF CARRYING THE THIN WAFERS

(75) Inventor: Shu-Jeng Yeh, Tao Yuan Shien (TW)

(73) Assignee: WIN Semiconductors Corp. (TW)

( * ) Notice: Subject to any disclaimer, the term of this patent is extended or adjusted under 35 U.S.C. 154(b) by 78 days.

(21) Appl. No.: 11/116,349

(22) Filed: Apr. 28, 2005

(65) Prior Publication Data
US 2006/0246828 A1 Nov. 2, 2006

(51) Int. Cl.
*B24B 41/06* (2006.01)
(52) U.S. Cl. .......................... 451/388; 269/21
(58) Field of Classification Search ................ 451/364, 451/388, 288, 289; 269/21; 125/23.01
See application file for complete search history.

(56) References Cited

U.S. PATENT DOCUMENTS 3,811,182 A * 5/1974 Ryan et al. ................. 29/25.01
3,949,295 A * 4/1976 Moorshead .................. 324/760
6,019,164 A * 2/2000 Getchel et al. ............. 165/80.1
6,386,191 B1 * 5/2002 Yoshimura et al. ........... 125/35

* cited by examiner

*Primary Examiner*—Robert A. Rose
(74) *Attorney, Agent, or Firm*—Lowe Hauptman & Berner, LLP

(57) ABSTRACT

A thin wafer carrying device includes a laminated board made of layers of compound material so that the thin wafer is put on the circular board. The compound material includes reinforcement material and high-polymer resin. A metal film good in electric conductivity is coated to the compound material. The compound material has been used in printed circuit boards. The carrying device includes a plurality of tiny holes and a vacuum system located beneath the circular board. The thin wafer is attracted on the carrying device by the method of vacuum and is convenient to be tested, processed and transported.

7 Claims, 5 Drawing Sheets

| Features\Items | Price | Lead Time | Flatness | Electric Conductivity | Thermal Conductivity | Fragile | Size and Sharp Feasibility | Yield Strength | Via hole | Vendors |
|---|---|---|---|---|---|---|---|---|---|---|
| SiC carrying device | High | Medium | Good | Bad | Bad | Yes | Bad | Good | Small | Few |
| Aluminum carrying device | Medium | Long | Fair | Good | Good | No | Bad | Bad | Large | Few |
| Thin wafer carrying device of the present invention | Low | Short | Fair | Good | Good | No | Good | Good | Medium | many |

| Features \ Items | Price | Lead Time | Flatness | Electric Conductivity | Thermal Conductivity | Fragile | Size and Sharp Feasibility | Yield Strength | Via hole | Vendors |
|---|---|---|---|---|---|---|---|---|---|---|
| SiC carrying device | High | Medium | Good | Bad | Bad | Yes | Bad | Good | Small | Few |
| Aluminum carrying device | Medium | Long | Fair | Good | Good | No | Bad | Bad | Large | Few |
| Thin wafer carrying device of the present invention | Low | Short | Fair | Good | Good | No | Good | Good | Medium | many |

Fig. 5

DEVICE FOR CARRYING THIN WAFERS AND METHOD OF CARRYING THE THIN WAFERS

FIELD OF THE INVENTION

The present invention relates to a carrying device which includes tiny holes and a vacuum system sucks the thin wafers on the carrying device via the tiny holes.

BACKGROUND OF THE INVENTION

A wafer used as a basic material for semi-conductor is proceeded steps of ingot grow, slicing, lapping, cleaning and polishing before it is ready to be used. A series of checking and measuring are taken so that the thin wafer meets the requirements of the customers. Generally, the thickness of a thin wafer is only few mils and fragile. It is not possible to carry the thin wafer by robots or manual to test, ship and/or proceed. The thin wafer is put on a carrying device for convenience of shipping or testing.

As shown in FIG. 1, a thin wafer 90 to be test is put on a carrying device 91 which includes a plurality of tiny holes 92 defined therethrough and a vacuum system 93 is used to suck the air in a chamber 94 in the vacuum system 93 and the tiny holes 92 so as to attract the thin wafer 90 on the carrying device 91. Therefore, a probe 96 of a detection device 95 can lower and access the thin wafer 90 to proceed series of checking processes. The bottom of the thin wafer 90 in contact with the carrying device 91 is ground for convenience of test.

The conventional carrying device 91 is made of silicon carbide which is stiff with high yield strength and flat so that the thin wafer 90 can be snugly attracted on the carrying device 91 without sliding. The thin wafer 90 can be well supported on the carrying device 91 having the tiny holes 92 even if the probe 96 touches the thin wafer 90. Nevertheless, the silicon carbide is expensive and poor of electric conductivity and heat conductivity. Therefore, a circuit without front side ground is impossible to be tested by using silicon carbide.

Referring to FIGS. 2 to 3B, aluminum is used as the carrying device 100 which is less expensive compared with the silicon carbide and includes better heat conductivity and electric conductivity. Although the yield strength of the aluminum carrying device 100 is lower than that of the silicon carbide, it is strong and can be machined to have a smooth surface. However, it is difficult to drill holes in the aluminum carrying device 100 so that the manufacturers set grooves 102 on the surface of the carrying device 100 and the holes 101 are drilled at the cross points of the grooves 102. The vacuum system 93 sucks the air in the holes 101 and grooves 102 to attract the thin wafer. When the probe 96 touch the area of the thin wafer 10 where the grooves 102 or holes 101 are located, the thin wafer 90 tends to be bent due to less support at those positions. Besides, if the sizes of the holes 101 and the grooves 102 are larger than that of the chips of the thin wafer 90, the chip cannot be ground properly.

SUMMARY OF THE INVENTION

The object of the present invention is to provide a thin wafer carrying device that is less expensive, electric and heat conductive and stiff.

Another object of the present invention is to provide a method for carrying a thin wafer by using a vacuum system.

The present invention relates to a thin wafer carrying device which is a circular board comprising a laminated board made of layers of compound material so that the thin wafer is put on the circular board. The compound material includes reinforcement material and high-polymer resin, a metal film is coated to the compound material. The reinforcement material can be glass fibers, carbon fibers, and/or organic fibers. The high-polymer resin can be thermo-setting resin or thermo-plastic resin. The metal film is made of gold. The carrying device includes a plurality of tiny holes and a vacuum system located beneath the circular board. The thin wafer is attracted on the carrying device by the method of vacuum.

The present invention will become more obvious from the following description when taken in connection with the accompanying drawings which show, for purposes of illustration only, a preferred embodiment in accordance with the present invention.

BRIEF DESCRIPTION OF THE DRAWINGS

FIG. 5 is a comparison between the silicon carbide carrying device, the aluminum carrying device and the thin wafer carrying device of the present invention.

DETAILED DESCRIPTION OF THE PREFERRED EMBODIMENT

Figure 1:
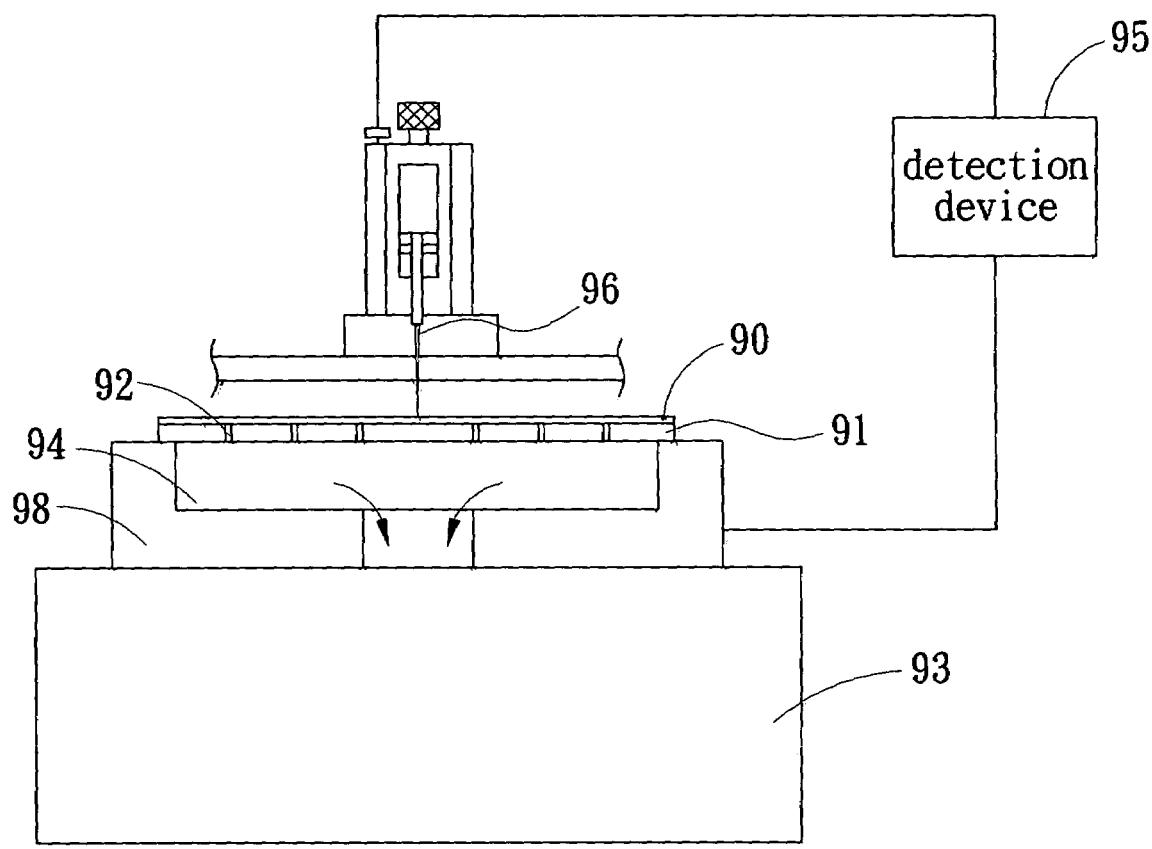
FIG. 1 shows a conventional carrying device and a vacuum system.
Figure 2:
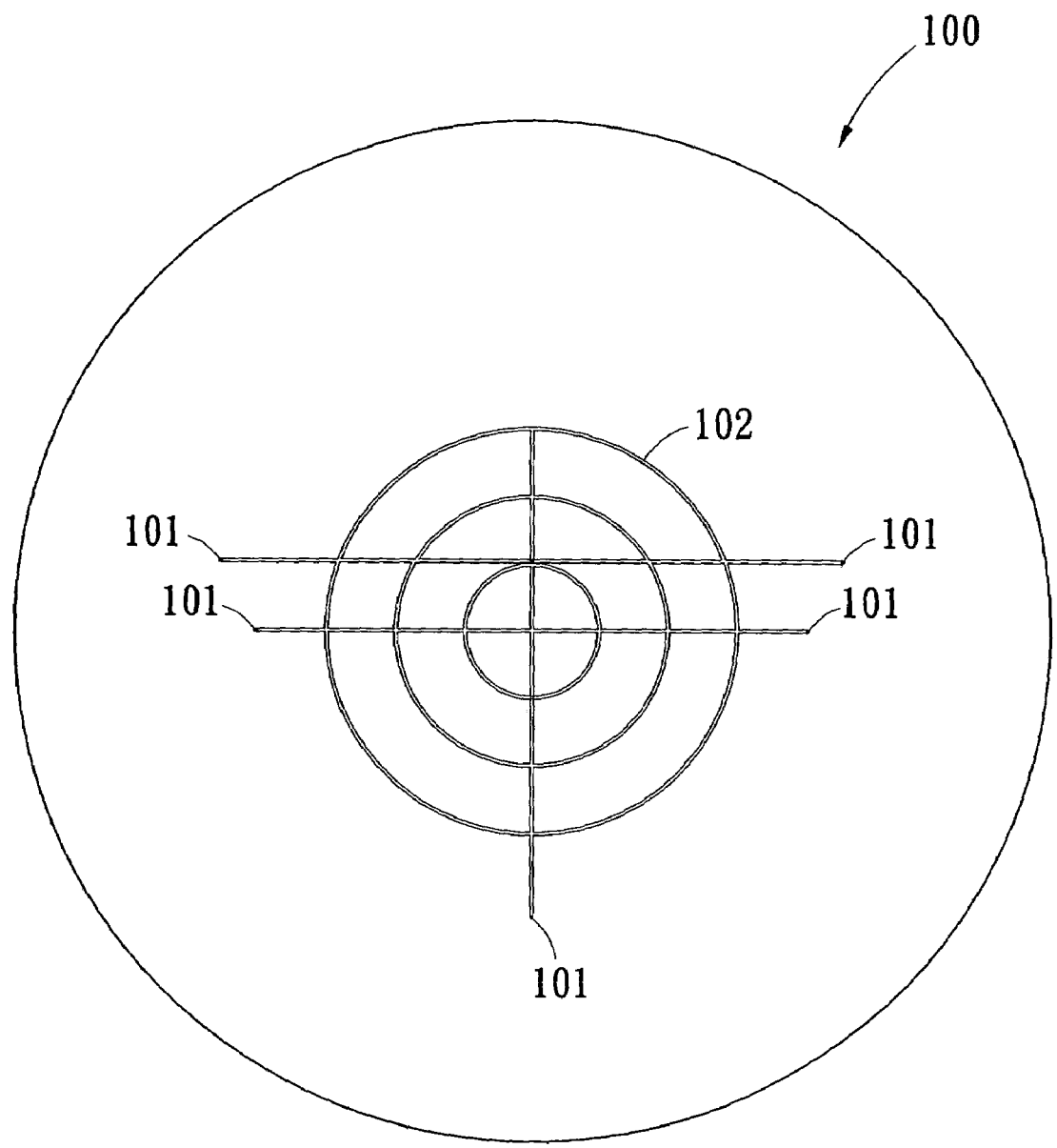
FIG. 2 shows a conventional aluminum carrying device.
Figure 3A:
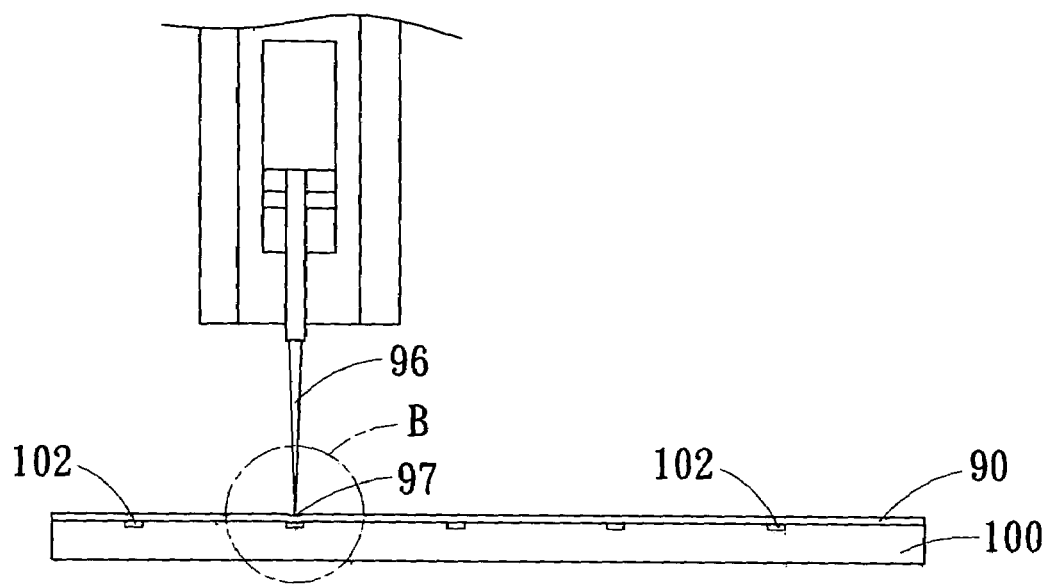
FIG. 3A is a cross sectional view to show a thin wafer put on the conventional aluminum carrying device.
Figure 3B:
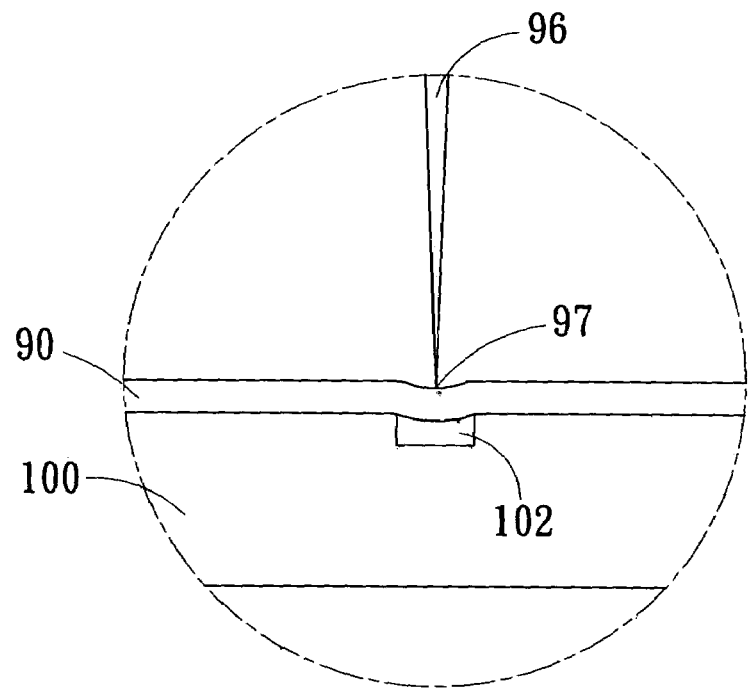
FIG. 3B is an enlarged view of FIG. 3.
Figure 4A:
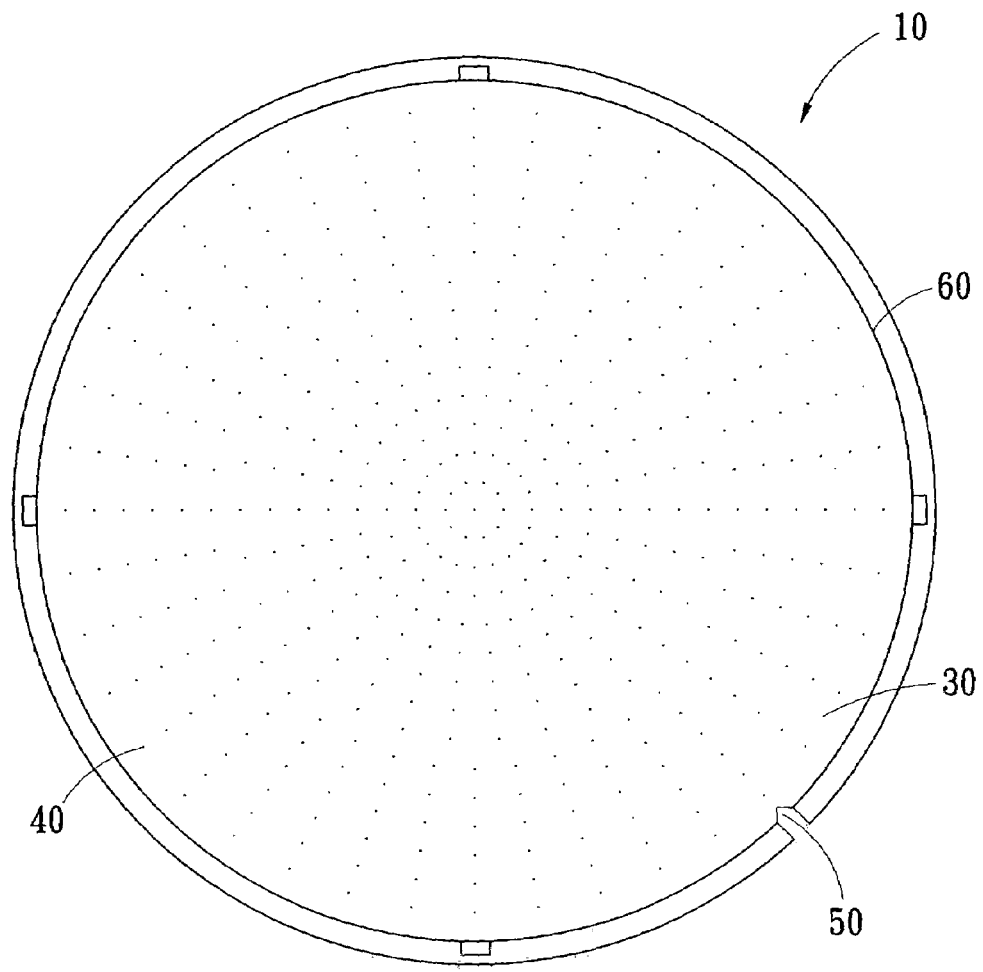
FIG. 4A shows a top view of the thin wafer carrying device of the present invention.
Figure 4B:
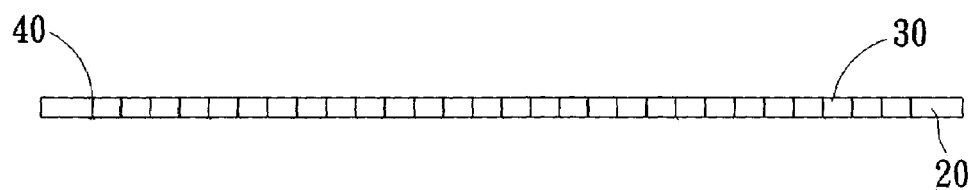
FIG. 4B shows a side view of the thin wafer carrying device of the present invention.

Referring to FIGS. 4A and 4B, the thin wafer carrying device 10 of the present invention comprises a laminated compound material board 20 which includes reinforcement material such as glass fibers, carbon fibers, and/or organic fibers, and high-polymer resin which can be thermo-setting resin or thermoplastic resin. Due to the stability and heat duration, the thermo-setting resin is preferred such as Epoxy is used in this embodiment. The laminated board 20 is strong enough to support the thin wafer 90. The number of layers of the lamination of the board 20 is four and the thickness is in the range between 1 mm to 2 mm. The board 20 is coated by a metal film 30 which can be copper or gold which is electro-plated on the board 20 and good in electric conductivity. In this embodiment, the metal film 30 is a gold film of a thickness of 5 μm. The metal film 30 is well known and used in printed circuit boards for years.

The carrying device 10 is a circular board whose diameter can be varied according to needs, generally the carrying device 10 is made to be 6 inches and 8 inches in diameter. It is known that the 8-inch carrying device 10 can also be used to carry 6-inch thin wafers. A plurality of holes 40 are defined through the carrying device 10 and radial arrangement of the holes 40 is used in this embodiment. The number of the holes 40 is 440 and each have 0.1 mm in diameter which is the smallest hole used in most of the printed circuit boards. The diameter can also be reduced according practical needs. An access notch 50 is defined in a periphery of the carrying device 10 for convenience of operation, a guide circle 60 is printed on the carrying device 10 such that the user can easily align the thin wafers.

The method for carrying a thin wafer on a carrying device includes the following steps:

step 1: providing a carrying device 10 step 2: putting a thin wafer 90 on the carrying device 10, and step 3: disposing the carrying device 10 on a vacuum system 93 which sucks the air in the holes 40 so attract the thin wafer 90 on the carrying device 10.

FIG. 5 is a comparison between the silicon carbide carrying device, the aluminum carrying device 100 and the thin wafer carrying device 10 of the present invention. Some conclusions are obtained:

1. Lower Cost

The material used in the present invention has been used for years in the printed circuit boards so that the material can be easily prepared at low price.

2. Better Support Ability

The carrying device has high yield strength and is not bent so that it is ideal to support the thin wafers.

3. Better Physical Features

The carrying device is good in heat and electric conductivity and has flat surface, the probe may contact the surface of the carrying device to obtain a good electric conductivity. The size of the carrying device is not limited and can be manufactured as needed.

4. Small Holes

The material used in the carrying device of the present invention is suitable for drilling and the size of the holes can be kept as small as possible so as to overcome the shortcoming for the aluminum carrying device.

While we have shown and described the embodiment in accordance with the present invention, it should be clear to those skilled in the art that further embodiments may be made without departing from the scope of the present invention.

What is claimed is:

1. A method for carrying a thin wafer, comprising:
   step 1: providing a carrying device comprising a board made by multiple layers of laminated compound material and a metal film coated on the board, the laminated compound material including reinforcement material and high-polymer resin, a plurality of holes defined through the board;
   step 2: putting a thin wafer on the carrying device, and
   step 3: disposing the carrying device on a vacuum system which sucks the air in the holes so attract the thin wafer on the carrying device.

2. The method as claimed in claim 1, wherein the reinforcement material includes glass fibers, carbon fibers, or organic fibers, the high-polymer resin including thermo-setting resin or thermo-plastic resin.

3. The method as claimed in claim 1, wherein the carrying device is a circular board.

4. The method as claimed in claim 1, wherein the metal film is good in electric conductivity.

5. The method as claimed in claim 4, wherein the metal film is copper or gold.

6. The method as claimed in claim 4, wherein the diameter of each of the holes is sized for convenience of testing, transportation and processing the thin wafers.

7. The method as claimed in claim 6, wherein the diameter of the holes is 0.1 mm.

\* \* \* \* \*